(12) United States Patent
Yang et al.

(10) Patent No.: US 12,738,913 B2
(45) Date of Patent: Sep. 15, 2026

(54) CONTENT-AWARE AUDIO LEVEL MANAGEMENT

(71) Applicant: Dolby Laboratories Licensing Corporation, San Francisco, CA (US)

(72) Inventors: Shaofan Yang, Beijing (CN); Kai Li, Beijing (CN); Qianqian Fang, Beijing (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 175 days.

(21) Appl. No.: 18/706,547

(22) PCT Filed: Nov. 3, 2022

(86) PCT No.: PCT/US2022/048884
§ 371 (c)(1),
(2) Date: May 1, 2024

(87) PCT Pub. No.: WO2023/081315
PCT Pub. Date: May 11, 2023

(65) Prior Publication Data

US 2025/0038726 A1 Jan. 30, 2025

Related U.S. Application Data

(60) Provisional application No. 63/287,152, filed on Dec. 8, 2021.

(51) Int. Cl.
*H03G 3/32* (2006.01)
*H03G 3/30* (2006.01)

(52) U.S. Cl.
CPC ............ *H03G 3/32* (2013.01); *H03G 3/3089* (2013.01)

(58) Field of Classification Search
CPC .......... H03G 3/32; H03G 3/3089; H03G 3/20; G10L 21/0272; G10L 21/034;
(Continued)

(56) References Cited

U.S. PATENT DOCUMENTS 7,454,331 B2 11/2008 Vinton
9,349,384 B2 5/2016 Gunawan
(Continued)

FOREIGN PATENT DOCUMENTS

DE 10052104 A1 5/2002
WO 2007120453 A1 10/2007
(Continued)

OTHER PUBLICATIONS

Prétet, L., et al., Singing Voice Separation: A Study on Training Data, IEEE International Conference on Acoustics, Speech and Signal Processing (ICASSP), May 12-17, 2019, Brighton, UK, https://arxiv.org/pdf/1906.02618.pdf, 5 pages.

*Primary Examiner* — Xu Mei

(57) ABSTRACT

Described herein is a method of performing content-aware audio processing for an audio signal comprising a plurality of audio components of different types. The method includes source separating the audio signal into at least a voice-related audio component and a residual audio component. The method further includes determining a dynamic audio gain based on the voice-related audio component and the residual audio component. The method also includes performing audio level adjustment for the audio signal based on the determined audio gain. Further described are corresponding apparatus, programs, and computer-readable storage media.

33 Claims, 2 Drawing Sheets

(58) Field of Classification Search

CPC . G10L 21/0364; G10L 21/0208; G10L 25/93; G10L 25/90

USPC ....... 381/110, 94.7, 104, 107, 109; 704/208, 704/214

See application file for complete search history.

(56) References Cited

U.S. PATENT DOCUMENTS

| | | | | |
|---|---|---|---|---|
| 9,372,251 | B2 | 6/2016 | Soulodre | |
| 9,431,982 | B1 * | 8/2016 | Yang | H03G 3/20 |
| 9,756,445 | B2 | 9/2017 | Wang | |
| 10,014,838 | B2 | 7/2018 | Nakayama | |
| 10,063,207 | B2 | 8/2018 | Malak | |
| 10,210,883 | B2 * | 2/2019 | Geiger | H04S 3/008 |
| 10,580,417 | B2 | 3/2020 | Lee | |
| 10,595,144 | B2 | 3/2020 | Cardinaux | |
| 10,782,928 | B2 | 9/2020 | An | |
| 10,998,870 | B2 | 5/2021 | Aoyama | |
| 11,128,954 | B2 | 9/2021 | Raja Gunaseela Boopathy | |
| 11,335,357 | B2 * | 5/2022 | Gaalaas | G10L 21/0364 |
| 2009/0010453 | A1 * | 1/2009 | Zurek | G10L 21/0208 381/94.1 |
| 2014/0314256 | A1 | 10/2014 | Fincham | |
| 2015/0081287 | A1 * | 3/2015 | Elfenbein | G10L 21/0208 704/226 |
| 2017/0098456 | A1 * | 4/2017 | Ma | G10L 21/0388 |
| 2020/0083856 | A1 | 3/2020 | Tin Than | |
| 2020/0154202 | A1 | 5/2020 | Raja Gunaseela Boopathy | |
| 2021/0183356 | A1 | 6/2021 | Mars | |
| 2021/0183372 | A1 * | 6/2021 | Jansson | G10L 15/083 |
| 2021/0249027 | A1 | 8/2021 | Zeghidour | |

FOREIGN PATENT DOCUMENTS

| | | | |
|---|---|---|---|
| WO | 2007127023 | A1 | 11/2007 |
| WO | 2015183728 | A2 | 12/2015 |
| WO | 2019229199 | A1 | 12/2019 |
| WO | 2020152264 | A1 | 7/2020 |
| WO | 2021089544 | A1 | 5/2021 |
| WO | 2021195429 | A1 | 9/2021 |

* cited by examiner

400

420

410

430

440

CONTENT-AWARE AUDIO LEVEL MANAGEMENT

CROSS-REFERENCE TO RELATED APPLICATION

This application is a U.S. National Stage application under U.S.C. 371 of International Application No. PCT/US2022/048884, filed on Nov. 3, 2022, which claims priority of the following priority applications: U.S. Provisional Application No. 63/287,152 filed Dec. 8, 2021 and PCT Application No. PCT/CN2021/129105 filed Nov. 5, 2021. The contents of all of the above applications are incorporated by reference in their entirety for all purposes.

TECHNICAL FIELD

The present disclosure is directed to the general area of audio processing, and more particularly, to methods, apparatuses, and systems for performing content-aware audio processing, such as audio level management.

BACKGROUND

Broadly speaking, conventional dynamic processing of audio such as automatic gain control (AGC) and dynamic range compression (DRC) may generally measure the level of an audio signal in some manner, and then multiply the audio by a time-varying (or time- and frequency-varying) generated gain which is an amount that might be a function of the measured level. The AGC typically strives to adjust the output audio level closer to a target level, and the generated gain changes relatively slowly, which can be treated as making the long-term level of the audio equal to the target level. But the short-term level may fluctuate significantly around this target. On the other hand, the DRC typically strives to adjust the short-term level and limit the fluctuations to some acceptable range for compressing the range of the level, which means that soft sounds are mapped to higher levels and loud sounds are mapped to lower values.

For traditional movie, TV, or music content, large level differences may occur depending on how the content is produced. In mobile playback audio processing, a volume leveler (in which the key modules are typically the AGC and DRC) aims to provide a consistent loudness to the consumer so that loudness differences between programs and within programs are reduced. The volume leveler was originally designed for professionally generated content (PGC) like movie, TV, or music, that is recorded by professional devices in a recording studio and/or post-produced by a professional engineer or artist. But since technological advances have made it easier to produce and share digital media content, the amount and variety of digital media content available for consumption continue to grow, from traditional television programs, movies, and music to modem vlogs, podcasts, and audiobooks. Therefore, the need for the volume leveler today has changed from processing PGC well to processing both PGC and user-generated content (UGC) well. In a broad sense, UGC may be considered to refer to digital media content that is typically recorded in non-professional environments, such as homes or offices, often with user devices, such as tablets, smartphones, or laptops, like some vlogs, podcasts, live-streaming, etc.

Typically, an audio stream might be treated as a mixture that contains different audio objects, for example, a movie segment may contain speech, music background, and the sound effect at the same time, or a vlog segment may contain speech and the background noise at the same time. As mentioned above, conventional AGC and DRC techniques may multiply the whole mixture by a time-varying or time- and frequency-varying calculated gain and do not further analyze the object characteristics of the object in the content. Therefore, when dealing with diverse content, conventional AGC or DRC techniques may suffer from the issue that the low-level unwanted noise may be boosted as well, and in addition, some noise pumping may also be introduced by AGC or DRC, especially for some UGC with poor recording environments.

In view thereof, generally speaking, there appears to exist a need for techniques of performing content-aware (e.g., PGC and/or UGC-aware) processing of audio signals, in order to address at least some or all of the above issues.

SUMMARY

In view of the above, the present disclosure generally provides a method of performing content-aware audio processing for an audio signal, a corresponding apparatus, a program, as well as a computer-readable storage media, having the features of the respective independent claims.

According to a first aspect of the present disclosure, a method of performing content-aware audio processing for an audio signal is provided. The audio signal may be represented as an audio waveform (frames) in the time-frequency domain, or the like. Depending on implementations, the audio may be first—if necessary—pre-processed. In some possible implementations, this may involve (but is certainly not limited to) dividing the audio signal into a sequence of windowed, (half-)overlapping blocks, converting the audio signal data to the frequency domain (e.g., by using a filter bank, a time-frequency transformation such as fast Fourier transform (FFT), etc.), or the like, Further, the audio signal may be seen as a mixture that comprises a plurality of audio components (or sometimes also referred to as audio objects) of different types. As can be understood and appreciated by the skilled person, depending on possible implementations, use cases and/or requirements, audio components (audio objects) may be classified into various types, such as (but certainly not limited thereto) voice, (background) noise, or—if necessary—even further classified into speech, singing, laughter, music, instrument sound, (artificial) sound effect, etc. For instance, a movie segment may be understood to generally contain speech, background music, and sound effects at the same time, while a vlog segment may be understood to generally contain speech and background (ambient) noise at the same time. As another simple illustrative example, in some possible implementations, the audio components (audio objects) comprised in the audio signal may be simply categorized as of a "voice" type or of a remaining "residual" type.

In particular, the method may comprise source separating the audio signal into at least a voice-related audio component and a residual audio component. As illustrated above, the voice-related audio component may be understood to comprise (human or animal) voice(s), such as speech, singing, laughter, or the like; whilst the remaining components, such as (background) noise, sound effect, musical instrument sound, or the like may all be understood to be comprised in the residual audio component. In some possible cases, the (source) separation may also be referred to as voice extraction (in other words, to extract the "voice" (component) out from other "residual" component(s) of the whole audio signal). As may be understood and appreciated by the skilled person, processes related to the (source)

separation may be implemented in any suitable manner. That is to say, depending on various implementations and/or requirements, the source separation (or in some cases, the voice extraction) functionality may be achieved for example by using a deep neural network (DNN)-based methodology and/or a (regular) signal processing-based methodology. Further, the source separation functionality may be achieved by any appropriate measures known to the skilled person. In addition, the voice-related audio component and the residual audio component may be separated (or extracted) in parallel or in sequence, as can be understood and appreciated by the skilled person.

In addition, the method may further comprise determining a dynamic audio gain based on the voice-related audio component and the residual audio component. The audio gain may be a dynamic gain in the time-frequency domain (or put differently, a time-frequency varying gain value). In other words, the so-determined audio gain may have a varying value for each time-frequency bin, i.e., one value for each time-frequency bin, with potentially different values for different bins.

Finally, the method may yet further comprise performing audio level adjustment for the audio signal based on the determined audio gain. Since, as indicated above, the audio gain may be a dynamic gain in the time-frequency domain, the audio level adjustment may involve applying the (time-frequency varying) audio gain to the (respective amplitude of the) audio signal (also in the time-frequency domain), as can be understood and appreciated by the skilled person. For instance, in some possible implementations, applying the (time-frequency varying) audio gain to the input audio signal may involve applying each value (of a sequence of values) of the gain to a corresponding value (e.g., of a sequence of values) of the input audio signal in order to generate the respective value of the output audio signal.

Configured as described above, the proposed method may generally provide an efficient yet flexible manner for performing content-aware audio processing for an audio signal that comprises a plurality of audio components of different types, thereby improving the audio quality e.g. that is perceived by the end user. To the contrary, as noted above, conventional AGC and DRC techniques may generally multiply the whole audio mixture (including the voice and residual such as noise) by a (same) audio gain, which may cause the noise floor to be boosted and/or introduce unwanted perceptible pumping (especially in cases where UGCs typically being prepared in poor recording environments might be involved).

In some example implementations, the dynamic audio gain may be a time varying and frequency dependent audio gain. In other words, as illustrated above, the gain may have a varying value for each time-frequency bin (in the time-frequency domain).

In some example implementations, the voice-related audio component may comprise a speech component and/or a singing component. Of course, as noted above, any other suitable voice-related audio component, such as laughter, other kinds of human (or even animal, e.g., cartoon character) made voice, or the like may be possible as well, as can be understood and appreciated by the skilled person.

In some example implementations, the residual audio component may comprise at least one of: a background sound component, a music (or musical instrument) component, a sound effect component, and/or a noise component. Similarly, any other suitable audio component that could not be (reasonably) classified into the voice-related audio component may be considered as a possible residual audio component, as can also be understood and appreciated by the skilled person.

In some example implementations, the source separation of the audio signal may involve determining a time-frequency gain indicative of a ratio of the voice-related audio component in the audio signal. That is to say, in simple words, the voice-related audio component may be obtained by applying (e.g., multiplying) such time-frequency gain to the overall audio signal (in the time-frequency domain). As illustrated above, this may be achieved for example by using a machine learning based (e.g., DNN) methodology to train the model for separating (extracting) the voice-related audio component(s) out from the audio signal. Of course, any other suitable implementation may be adopted as well, as can be understood and appreciated by the skilled person. As a result, it may be understood that the residual audio component may be determined as simple as subtracting the voice-related audio component from the overall audio signal. Incidentally, in some other implementations, it may also be possible to first determine/obtain the residual audio component (e.g., by determining a similar time-frequency gain indicative of a ratio of the residual audio component in the audio signal) and to subsequently subtract the residual audio component from the overall audio signal.

In some example implementations, the determination of the dynamic audio gain may involve identifying whether the residual audio component relates to noise or not. In some possible implementations, it may be reasonably assumed that a residual audio component relates to noise if such residual audio component does not relate to background (non-noise) sound, music sound (or musical instrumental sound), sound effect (e.g., natural or artificially created), or the like.

In some example implementations, the residual audio component may be represented in a plurality of time-domain blocks (e.g., partially overlapped). In such cases, the identifying of whether the residual audio component relates to noise or not may comprise determining a first confidence score indicative of whether a current block of the residual audio component relates to noise or not based on the current block and at least one time-adjacent block of the residual audio component. In some possible cases, the time-adjacent block of the residual audio component may refer to a previous block (i.e., chronologically earlier than the current block under process). In such cases, the residual component may be analyzed by using the current block and the adjacent historical block sequence (sometimes also referred to as a "look back" approach), and then the current block may be accordingly identified as either related to (predefined) music/sound effect or noise. In some other possible cases, particularly when latency may be tolerated to some extent for instance in some (e.g., non-real-time) applications, it may also be possible to use one or more future blocks (e.g., frames), i.e., that are chronologically later than the current block under process (sometimes also referred to as a "look ahead" approach), for the determination of the first confidence score indicative of whether the current block of the residual audio component relates to noise or not. Similar to the above-illustrated source separation (voice extraction), such analysis and classification process (regardless of "look back" or "look ahead") may be implemented by using any suitable means, which may include but is certainly not limited to, (regular) signal processing techniques, machine learning based methodologies, or the like.

In some example implementations, the determination of the dynamic audio gain may involve identifying whether the audio signal relates to professionally generated content (PGC) or user generated content (UGC). Broadly speaking, as may also be understood and appreciated by the skilled person, the term PGC may generally refer to content like movies, TV, music, or the like, which is typically prepared (e.g., recorded, processed, etc.) by professional devices (e.g., camera systems, recording systems, etc.) for example in a professional environment (e.g., a recording studio) and often further post-produced by one or more professional engineers or artists; while on the other hand, the term UGC may generally refer to (digital) media contents, e.g., vlogs, podcasts, live-streaming, etc., that is typically prepared (recorded) in non-professional environments, such as homes or offices, often with regular (less or non-professional) user devices, such as tablets, smartphones, or laptops.

In some example implementations, the audio signal may be represented in a plurality of time-domain blocks. In such cases, identifying whether the audio signal relates to professionally generated content or user generated content may comprise determining a second confidence score indicative of whether a current block of the audio signal relates to professionally generated content or user generated content based on the current block and at least one time-adjacent block of the audio signal. Notably, similar to the above illustration with respect to the determination of the first confidence score, the determination of the second confidence score may also be implemented based on one or more preceding or subsequent blocks.

In some example implementations, the determination of the dynamic audio gain may involve first determining a scaling function based on at least one loudness measure (metric) of the audio signal, and the dynamic audio gain may be determined based on the scaling function. As can be understood and appreciated by the skilled person, the loudness metric may be measured in the loudness domain (e.g., represented in a sequence of bands), usually in the unit of Sone or the like. As will be discussed in more detail below, such scaling function may be implemented in any suitable means, depending on implementations.

In some example implementations, the scaling function may involve a first loudness scaling (sub-)function for controlling long term loudness of the audio signal and a second loudness scaling (sub-)function for controlling short term loudness of the audio signal. In some possible cases, for the sake of understanding, it may be generally assumed that the long-term loudness may be considered to be related to (e.g., controllable) AGC to some extent, while the short-term loudness may be considered to be related to (e.g., controllable) DRC to some extent.

In some example implementations, the first loudness scaling function may be determined based on a wideband loudness measure of the audio signal being remixed using the voice-related audio component and the residual audio component by attenuating any noise component contained in the residual audio component when the audio signal is identified to relate to user generated content. In some possible cases, the noise component may be completely removed from the residual audio component (e.g., by a simple multiplication of a gain value 0 to the noise component). Of course, as can be understood and appreciated by the skilled person, in some other possible implementations, the attenuation may also be achieved for example by applying a "soft" gain value (between 0 and 1, e.g., 0.2 or the like) to the noise component. As such, the noise component is largely (or totally) attenuated (only) when it is determined that the audio signal is identified as UGC. One of the main reasons for such attenuation is that in the case of UGC (such as a vlog) for example prepared by a (non-professional) user on a normal handheld device (such as a mobile phone), the noise contained therein may very likely be related to (unwanted or undesirable) background noise rather than intended (necessary) background sound that may convey some information of the creator's intent (which is typically the case in PGCs prepared by one or more professionals). Thus, by attenuating such (unwanted) noise, undesirable boosting or pumping of the noise (during the application of the dynamic audio gain on the audio signal remix) that may be noticeable when applying conventional techniques can be avoided.

In some example implementations, the second scaling function may be determined based on a multi-band (sub-band) loudness measure of the audio signal being remixed using the voice-related audio component and the residual audio component by attenuating any noise component contained in the residual audio component when the audio signal is identified to relate to user generated content. The attenuation of the noise component for the second scaling function may be considered analogous or similar to the above attenuation of the noise component for the first scaling function, and repetition is avoided for the sake of conciseness.

In some example implementations, the audio signal may be remixed based on the first and second confidence scores, such that the noise component is attenuated when the audio signal is identified to relate to user generated content. Specifically, by adopting the first confidence score that is indicative of whether the residual audio component relates to noise or not and the second confidence score that is indicative of whether the audio signal relates to professionally generated content or user generated content, attenuation of the noise component in the residual audio component may be effectively performed, thereby improving the final listening experience of the end user.

In some example implementations, the second scaling function may be determined (e.g., calculated) based on the first scaling function. That is to say, in some possible implementations, the first (long-term loudness related) loudness scaling function may be determined first, and subsequently the second (short-term loudness related) loudness scaling function may be determined (e.g., calculated) by taking the first loudness scaling function into account as well. For instance, in some possible cases, it may be considered to scale each band (e.g., in the loudness domain) by the ratio of the long-term overall loudness to the long-term specific loudness in order to compute the short-term scaling in each band, such that the average spectral balance may be maintained.

In some example implementations, the first loudness scaling function $S_1[t]$ may be determined as a function $\Phi_1$ of a first predetermined output loudness measure $L_{o\_1}[t]$ and a first input loudness measure $L_{i\_1}[t]$ according to $S_1[t]=\Phi_1\{L_{o\_1}[t], L_{i\_1}[t]\}$, wherein $L_{i\_1}[t]=L_X[t]+(1-P_Y[t]P_Z[t])L_Y[t]$ and where $L_X[t]$ denotes a first loudness measure calculated for the voice-related audio component, $L_Y[t]$ denotes a first loudness measure calculated for the residual audio component, $P_Y[t]$ denotes a confidence score indicative of whether the residual audio component is identified to relate to noise, $P_Z[t]$ denotes a confidence score indicative of whether the audio signal is identified to relate to user generated content, and t denotes the time index. Of course, it is to be noted that such first loudness scaling function $S_1[t]$ is merely provided as one illustrative example (but certainly not as a limitation of any kind). As can be understood and appreciated by the skilled person, any other suitable methodology may be adopted in order to implement the first loudness scaling function.

In some example implementations, the second loudness scaling function $S_2[b, t]$ may be determined as a function $\Phi_2$ of a second predetermined output loudness measure $N_{o\_2}[t]$ and a second input loudness measure $N_{i\_2}[t]$ and may be further based on the first loudness scaling function $S_1[t]$ according to $S_2[b, t]=\Phi_2\{N_{i\_2}[b, t], N_{o\_2}[b, t], L_{o\_1}[t], L_{i\_1}[t], S_1[t]\}$, wherein $N_{i\_2}[b, t]=N_X[b, t]+(1-P_Y[t]\ P_Y[t])N_Y[b, t]$, and where $N_X[t]$ denotes a second loudness measure calculated for the voice-related audio component, $N_Y[t]$ denotes a second loudness measure calculated for the residual audio component, and b denotes the band index in the loudness domain. Similar to the above, such second loudness scaling function $S_2[b, t]$ is also merely provided as one illustrative example (but certainly not as a limitation of any kind). As can be understood and appreciated by the skilled person, any other suitable methodology may be adopted in order to implement the second loudness scaling function.

In some example implementations, the (overall) scaling function $S[b, t]$ may be determined based on the first loudness scaling function $S_1[b, t]$ and the second loudness scaling function, for example according to $S_2[b, t]$ as $S[b, t]=S_1[t]S_2[b, t]$.

In some example implementations, the audio level adjustment may be performed such that any noise component in the residual audio component is attenuated when the audio signal is identified to relate to user generated content.

In some example implementations, the audio level adjustment may be performed by applying the determined audio gain in the time-frequency domain according to $Z[k, t]=G[k, t]\{X[k, t]+(1-P_Y[t]\ P_Y[t])Y[k, t]\}$, wherein $Z[k, t]$ denotes the level-adjusted audio signal, $X[k, t]$ denotes the voice-related audio component in the audio signal, $Y[k, t]$ denotes the residual audio component in the audio signal, $P_Y[t]$ denotes a confidence score indicative of whether the residual audio component is identified to relate to noise, $P_Z[t]$ denotes a confidence score indicative of whether the audio signal is identified to relate to user generated content, k denotes the frequency index, and t denotes the time index.

In some example implementations, the source separation of the audio signal and/or the determination of the dynamic audio gain may involve at least one machine learning-based algorithm. As noted above, in some other possible implementations, suitable signal processing techniques may be additionally or alternatively adopted, for implementing the source separation of the audio signal and/or the determination of the dynamic audio gain.

According to a second aspect of the present invention, an apparatus including a processor and a memory coupled to the processor is provided. The processor may be adapted to cause the apparatus to carry out all steps according to any of the example methods described in the foregoing aspect.

According to a third aspect of the present invention, a computer program is provided. The computer program may include instructions that, when executed by a processor, cause the processor to carry out all steps of the example methods described throughout the present disclosure.

According to a fourth aspect of the present invention, a computer-readable storage medium is provided. The computer-readable storage medium may store the aforementioned computer program.

It will be appreciated that apparatus features and method steps may be interchanged in many ways. In particular, the details of the disclosed method(s) can be realized by the corresponding apparatus (or system), and vice versa, as the skilled person will appreciate. Moreover, any of the above statements made with respect to the method(s) are understood to likewise apply to the corresponding apparatus (or system), and vice versa.

BRIEF DESCRIPTION OF DRAWINGS

Example embodiments of the present disclosure are explained below with reference to the accompanying drawings, wherein like reference numbers indicate like or similar elements, and wherein.

DETAILED DESCRIPTION

Figure 1:
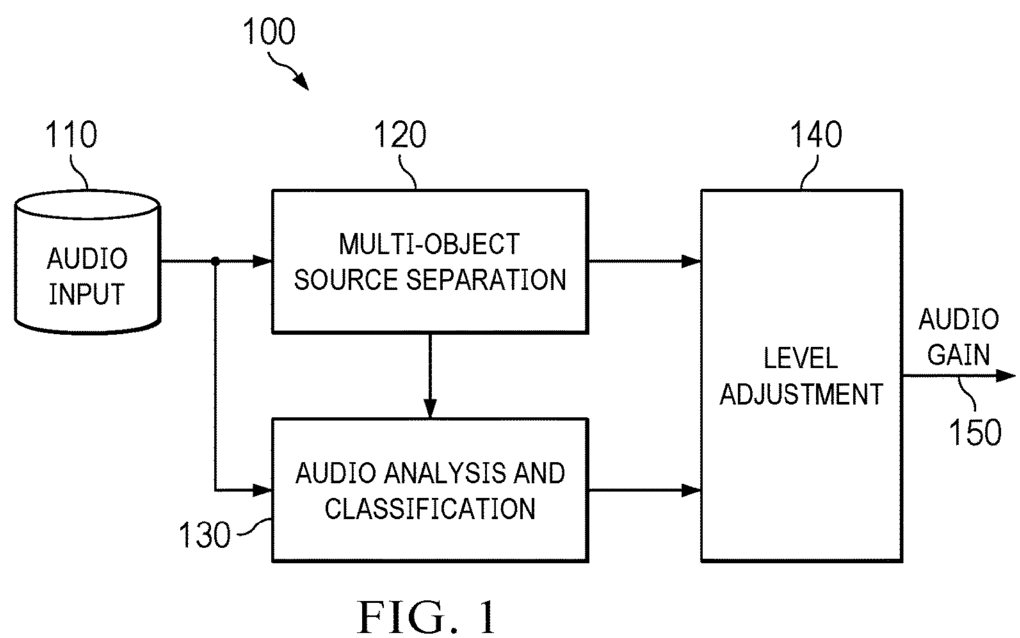
FIG. 1 is a schematic illustration showing an example content-aware audio level management system according to embodiments of the present disclosure.

As indicated above, identical or like reference numbers in the present disclosure may, unless indicated otherwise, indicate identical or like elements, such that repeated description thereof may be omitted for reasons of conciseness.

Particularly, the Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Furthermore, in the figures, where connecting elements, such as solid or dashed lines or arrows, are used to illustrate a connection, relationship, or association between or among two or more other schematic elements, the absence of any such connecting elements is not meant to imply that no connection, relationship, or association can exist. In other words, some connections, relationships, or associations between elements are not shown in the drawings so as not to obscure the present invention. In addition, for ease of illustration, a single connecting element is used to represent multiple connections, relationships or associations between elements. For example, where a connecting element represents a communication of signals, data, or instructions, it should be understood by those skilled in the art that such element represents one or multiple signal paths, as may be needed, to affect the communication.

As illustrated above, although some conventional audio processing techniques such as AGC and/or DRC may be configured to measure the level of the audio signal in some manner and then gain-modify the signal, these conventional techniques typically multiply the whole audio mixture by a (same) dynamic gain, which would cause the noise floor, especially in most UGC cases, to be boosted and/or would cause unwanted perceptible noise pumping.

In some possible examples, a dynamic processing method based on the psychoacoustic loudness model has been proposed, which may be considered to have several advantages. First, measurements and modifications may be specified in units of Sone, which is generally understood as a more accurate measure/metric of loudness perception than more basic measures such as peak or root mean square (RMS) power. Secondly, the audio may be modified such that the perceived spectral balance of the original audio could be maintained as the overall loudness is changed. This way, changes to the overall loudness may become less perceptually apparent in comparison to a dynamics processor that utilizes a wideband gain, for example, to modify the audio. Lastly, the psychoacoustic model may typically be inherently multi-band, and therefore the system could be easily configured to perform multi-band dynamic processing to alleviate the well-known cross-spectral pumping problems typically associated with a wideband dynamics processor.

However, although performing dynamic processing in the loudness domain may be considered to hold several advantages, the gain computation based on the whole mixture may for example still suffer from the noise boost problem when the input noise level is located at the boosting area of the predefined dynamic curve. Besides, in some possible cases when an audio clip under consideration has three adjacent segments, namely: the first noise segment, the second speech over noise segment, and the third noise segment, the conventional dynamic processing may be configured to boost the level in the first and third noise segments while maintaining the level in the second segment, which would cause the original steady background noise to become perceptually pumping.

In view thereof, in a broad sense, the present disclosure generally seeks to propose techniques and/or mechanisms to enable smart signal (e.g., audio) processing (e.g., level management) based on audio separation and analysis, for better content-aware processing performance and improved audio quality, regardless of the nature of the content as either professionally generated content or user generated content.

In particular, in order to address some or all of the above issues and thereby improve the performance of audio processing (such as by the level management) in various audio contents (e.g., PGC, UGC, etc.), the present disclosure generally proposes to first perform a multi-object source separation to separate the audio into one or more (prominent) audio objects (or audio component) and the residual, each of which may for example be stored in a separate track. Then, an audio analysis may be performed to further identify audio clusters of the audio and the previously separated audio objects (or tracks). For instance, in some possible implementations, the audio signal (as a whole) may be classified as either a PGC or a UGC (cluster). Further, in some possible implementations, the previously separated residual component (within the audio signal) may be classified as a noise class (cluster), a music/sound effect class (cluster), or the like. Depending on implementations, such classification or clustering process may be performed by using any useable means. As an illustrative (but non-limiting) example, a respective confidence score for each possible classification/cluster may be determined (e.g., calculated) based on for example machine learning based methodologies or the like. Thereafter, a level adjustment may be performed in order to derive a dynamic gain and to apply such gain to the remixing audio based on corresponding cluster information as previously identified.

While the remainder of the present disclosure will frequently make reference to level management/adjustment for an audio signal, it is understood that these serve as an example of audio processing in general and that the present disclosure shall not be construed as being limited to level management/adjustment.

Referring now to the drawings, FIG. 1 is a schematic illustration showing a (high-level) example of a content-aware audio level management system 100 according to embodiments of the present disclosure.

Particularly, as illustrated in FIG. 1, an audio input (audio input signal) 110 is provided first. The input audio signal 110 may be represented in any suitable format/form (e.g., waveform, frames), depending on implementations. As noted above, broadly speaking, an audio stream might be treated as a mixture that may typically contain various audio objects or components. For instance, a movie segment (as an illustrative example for PGC) may be understood to contain speech, music background, and sound effects at the same time. On the other hand, a vlog segment (as an illustrative example for UGC) may be understood to contain speech and background noise at the same time. In addition, as can be understood and appreciated by the skilled person, the input audio signal may undergo certain suitable or necessary pre-processing (not shown in the drawings) before any specific audio processing of the present disclosure is to be applied, depending on circumstances. For instance, such pre-processing may include, but is certainly limited to, dividing the audio waveform/frame into windowed, overlapping blocks, converting the audio data to the frequency domain (e.g., using a filter band or a time-frequency transformation such as FFT, or the like), etc.

Subsequently, as shown in block 120, the (potentially pre-processed) audio input 110 may be passed on for multi-object source separation in order to separate the audio 110 into one or more prominent audio objects/components (which typically comprise those voice-related audio components) and the (remaining) residual. In some possible implementations, each of these separated audio objects may be stored in a separate track for necessary further processing at a later time.

Further, as exemplified in block 130, an audio analysis and classification step may be performed in order to further identify audio clusters of the audio and the separated objects (or tracks). For this, as is reflected in FIG. 1, the analysis and classification block 130 may take, in addition to the source-separated audio objects (which may comprise the voice-related audio components and the residual) from block 120, also the (original) input audio 110 as input.

Finally, in block 140, a dynamic (time-frequency varying) gain (150) may be derived, in order to be applied to the remixing audio based on the corresponding cluster information as determined in block 130.

Figure 2:
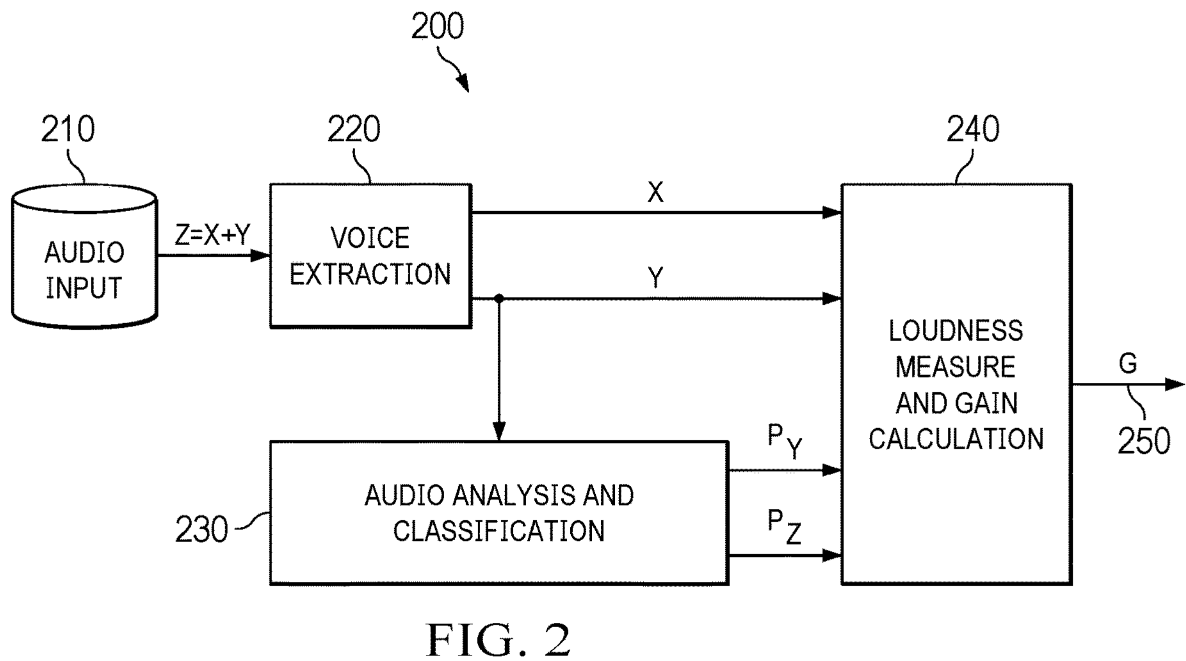
FIG. 2 is a schematic illustration showing another example content-aware audio level management system according to embodiments of the present disclosure.

Now reference is made to FIG. 2, which schematically illustrates another example of a content-aware audio level management system 200 according to embodiments of the present disclosure. As indicated above, identical or like reference numbers in FIG. 2 may, unless indicated otherwise, indicate identical or like elements in the example system 100 of FIG. 1, such that repeated description thereof may be omitted for reasons of conciseness.

Particular, in the example implementation of a level management system 200 as shown in FIG. 2, an audio signal 210, which is exemplarily represented as z[n], may be first divided into windowed, half-overlapping blocks, and then converted into the frequency domain, using either a filter bank or a time-frequency transformation, such as the FFT or the like. In general, the audio signal 210 may be said to be converted into the frequency domain.

The amplitude of the content of each block may be represented as Z[k, t] (sometimes also referred to as bins), where k represents the frequency index and t represents the time index.

As noted above, the multi-object source separation may be implemented by any suitable means, such as a voice extraction function 220. In some possible implementations, the voice extractor 220 may be configured to separate a voice component from an audio signal comprising the voice component and the residual component. As can be understood and appreciated by the skilled person, the "voice" here may be understood to include speech, singing, or the like. On the other hand, the "residual" may be any other (e.g., background) sound including (but not limited to) music instrument sound, sound effects, noise, etc. Depending on implementations, the voice extraction function may be a (regular) signal processing-based method, or a machine learning (e.g., deep neural network (DNN))-based method. For instance, in some possible implementations, the (machine learning-based) method $f_{VE}$ may be trained to learn a time-frequency gain g[k, t] to represent the ratio of voice in the whole mixture Z[k, t] as:

$$g[k,t]=f_{VE}\{Z[k,t]\} \tag{1}$$

The same result could be achieved by different, non-machine-learning approaches. As a result, the voice part X[k, t] and the residual Y[k, t] may be respectively computed as:

$$X[k,t]=Z[k,t]*g[k,t] \tag{2}$$

$$Y[k,t]=Z[k,t]-X[k,t] \tag{3}$$

It may be worthwhile to note that although the example illustrated above appears to attempt to separate the audio input into only two parts, namely the voice-related part and the (remaining) residual part, this does not necessarily have to be always this case. In other words, the audio input may be source separated into two more than two parts, depending on implementations. For instance, in some possible implementations the voice-related component may be sub-divided to further extract a speech-related audio component; while in some other possible implementations, the residual component may be sub-divided to further extract an (artificial) sound effect audio component, for example.

In such cases, as can be understood and appreciated by the skilled person, the machine learning-based method may be trained to determine a suitable mask (similar to the above-mentioned time-frequency gain g) for each extracted/separated audio component which may be seen to represent the ratio of the respective audio component in the whole audio input mixture.

As a result, the above-exemplified equations (2) and (3) may also be similarly extended. Specifically, depending on the implementation of the (potentially machine learning-based) method, the audio components may be extracted/separated in parallel (e.g., a speech audio component W[k, t] being extracted directly from the input audio Z[k, t] together with other audio components) or in sequence (e.g., a music audio component V[k, t] being extracted from the residual component Y[k, t] which has been firstly extracted directly from the input audio Z[k, t]).

Subsequently, the residual component may be analyzed, as exemplified in the audio analysis and classification block 230, by using the current block and the adjacent (e.g., historical) block sequence. Then, the current block may be identified as a predefined music/sound effect or noise class based on for example again a machine learning-based methodology $f_{Cof\_Y}$ or the like. For instance, in some possible implementations, a confidence score $P_Y[t]$ of the current block being identified as noise may be estimated or calculated as:

$$P_Y[t]=f_{Cof\_Y}\{Y[k,t],y[k,t-1],\ldots,y[k,t-t0]\} \tag{4}$$

In addition, the original audio signal 210 may also be analyzed based on the current block and the adjacent (e.g., historical) block sequence. In this case, the current block may be identified as a professionally-generated content (PGC) or a user-generated content (UGC), e.g., based on any suitable machine learning method $f_{Cof\_z}$ or the like. This time, a similar confidence score of the current block identified as UGC may be estimated or calculated as:

$$P_Z[t]=f_{Cof\_Z}\{Z[k,t],Z[k,t-1],\ldots,Z[k,t-t0]\} \tag{5}$$

It is to be noted that, depending on various implementations and/or requirements, the confidence scores $P_Y[t]$ and $P_Z[t]$ may be calculated as "hard" values (i.e., 0 and 1) or "soft" values between 0 and 1 (e.g., 0.8 or the like), as will be understood and appreciated by the skilled person. Furthermore, depending on various implementations and/or requirements, a value of $P_Y[t]=1$ (or close to 1) may be used to indicate that the current block is (certainly) identified as noise (or with reasonable certainty) while a value of $P_Y[t]=0$ (or close to 0) may be used to indicate that the current block is identified as not noise (or with reasonable certainty), or vice versa. Similarly, a value of $P_Z[t]=1$ (or close to 1) may be used to indicate that the current block is (certainly) identified as UGC (or with reasonable certainty) while a value of $P_Z[t]=0$ (or close to 0) may be used to indicate that the current block is identified as not UGC (or with reasonable certainty), or vice versa.

It is further to be noted that, although in the above example equations (4) and (5) the historical block(s) (sometimes also referred to as "look back") are used for calculating the respective confidence scores $P_Y[t]$ and $P_Z[t]$, in some other possible implementations (e.g., in applications where latency may be tolerated to some extent), it is also possible to use future block(s) (sometimes also referred to as "look ahead"), e.g., Y[k, t+1], . . . , Y[k, t+t1] and Z[k, t+1], . . . , Z[k, t+t1].

As can be understood and appreciated by the skilled person, an excitation measure may be computed in the loudness domain based on suitable frequency response measure(s) at critical bands over time. For instance, in some possible implementations, an excitation $E_Z[b, t]$ may be computed that somehow approximates the distribution of energy along the basilar membrane of the inner ear at a critical band b during a time block t as:

$$E_Z[b, t] = \lambda_b E_Z[b, t-1] + (1-\lambda_b)\sum_k |T[k]|^2 |C_b[k]|^2 |Z[k, t]|^2 \quad (6)$$

where T[k] generally represents the frequency response of a filter simulating the transmission of audio through the outer and middle ear, C[k] generally represents the frequency response of the basilar membrane at a location corresponding to the critical band b, and Ab generally represents the smoothing time constant chosen to proportionate the integration time of human loudness perception within the band b.

Specific loudness is a measure of perceptual loudness of an audio signal as a function of frequency and time. Accordingly, the transformation from excitation to specific loudness may be derived based on any suitable methodology, for instance by $$N_Z[b, t] = \Psi\{E_Z[b, t]\} \quad (7)$$

One possible methodology is to first transform the excitation at each band into an excitation level that would generate the same perceived loudness at for example 1 kHz. Then the specific loudness is computed from the transformed excitation $E_{Z1\ kHz}[b, t]$ by any suitable function, for instance $$N_Z[b, t] = \beta\left(\left(\frac{E_{Z1kHz}[b, t]}{Th_{1kHz}}\right)^{\alpha} - 1\right) \quad (8)$$

where $Th_{1\ kHz}$ is the threshold at 1 kHz and α and β are constants for example from experiment.

The total loudness (in the unit of Sone) may be calculated by summing the specific loudness across bands as:

$$L_Z[t] = \sum_b N_Z[b, t] \quad (9)$$

However, instead of measuring the total loudness of the whole mixture as in conventional techniques, in the embodiments of the present disclosure, the (for example given or predefined) AGC curve may be represented as a function $F_{AGC}$ that takes a measure of the remixing loudness of the audio steered by the previously determined confidence scores $P_Y[t]$ and $P_Z[t]$ as its input and generates the desired output loudness for example as:

$$L_{o\_AGC}[t] = F_{AGC}\{L_{i\_AGC}[t]\} \quad (10)$$

where the input remixing loudness $L_{i\_AGC}[t]$ may be derived for example as follows:

$$L_{i\_AGC}[t] = L_X[t] + (1 - P_Y[t]P_Z[t])L_Y[t] \quad (11)$$

where $1-P_Y[t]P_Z[t]=0$ when the residual is classified as UGC-noise, but $1-P_Y[t]P_Z[t]=1$ when the residual is classified as non-UGC-noise. As noted above, both $P_Y[t]$ and $P_Z[t]$ may be hard values or soft values (which means $P_Y[t]$, $P_Z[t] \in [0,1]$), depending on implementations and/or requirements.

The loudness modification scaling associated with the AGC $S_{AGC}[t]$ can then be computed as a function $\Phi_{AGC}$ of the output loudness and the input loudness, for example via $$S_{AGC}[t] = \Phi_{AGC}\{L_{o_{AGC}}[t], L_{i\_AGC}[t]\} \quad (12)$$

As can be understood and appreciated by the skilled person, the AGC function may generally attempt to make the long-term loudness of the audio equal to the target, but the short-term loudness may fluctuate significantly around this target.

Therefore, the DRC curve may be employed after the AGC in order to limit such fast fluctuations. In some possible implementations, the (for example given or predefined) DRC function $F_{DRC}$ can apply a multi-band dynamic processing that is also a function of a measure of the remixing specific loudness in each band instead of the total specific loudness of the audio steered by $P_Y[t]$ and $P_Z[t]$ as its input and generates the desired output specific loudness as:

$$N_{o\_DRC}[b, t] = F_{DRC}\{N_{i\_DRC}[t]\} \quad (13)$$

where the input remixing specific loudness may be derived for example as follows:

$$N_{i\_DRC}[b, t] = N_X[b, t] + (1 - P_Y[t]P_Z[t])N_Y[b, t] \quad (14)$$

It may be worthwhile to mention that in some possible implementations, in order to maintain the average spectral balance, a function $\Phi_{DRC}$ may be proposed to scale each band by the ratio of the long-term overall loudness after AGC to the long-term specific loudness to compute the DRC scaling in each band. Therefore, in such cases, the DRC scaling may be calculated for example by:

$$S_{DRC}[b, t] = \Phi_{DRC}\{N_{i_{DRC}}[b, t], N_{o_{DRC}}[b, t], L_{o_{AGC}}[t], L_{i_{AGC}}[t], S_{AGC}[t]\} \quad (15)$$

The AGC and DRC then may be combined to a total loudness scaling in each band:

$$S[b, t] = S_{AGC}[t]S_{DRC}[b, t] \quad (16)$$

Finally, the frequency gains G[k, t] may be generated by inverting the excitation scaling S[b, t] as a function $f_{inv}$ according to:

$$G[k,t]=f_{inv}\{S[b,t]\} \quad (17)$$

The overall dynamic processing can then be represented by applying the generated gain G[k, t] in time-frequency domain:

$$Z[k,t]=G[k,t]\{X[k,t]+(1-P_Y[t]P_Z[t])Y[k,t]\} \quad (18)$$

To summarize the above, as illustrated earlier, although techniques that involve performing dynamic processing in the loudness domain may be considered to have certain advantages, the gain computation based on the whole mixture may suffer from noise boosting problems when the input noise level is located at the boosting area of the predefined dynamic curve. Besides, when the audio clip under consideration has three adjacent segments, namely: the first noise segment, the second speech over noise segment, and the third noise segment, the conventional dynamic processing techniques may boost the level in the first and third noise segments and maintain the level in the second segments, which may cause the original steady background noise to become perceptually pumping.

However, according to embodiments of the present disclosure illustrated above, in a broad sense, such audio issues may be solved by jointly using the voice extractor and audio analysis functions (e.g., blocks 123 and 130 in FIG. 1 or blocks 220 and 230 in FIG. 2). In particular, instead of measuring the loudness and generating the gains corresponding to the whole mixture, the present disclosure generally provides an alternative technique/mechanism to measure the loudness by remixing the loudness of the voice and the residual, and the remixing parameter is calculated based on simultaneously determining whether the residual is classified as noise and whether the audio is classified as UGC. This generally means that the UGC noise residual would be remixed by using scaling parameter 0 (or a value close to 0, in cases of soft scaling parameters) and other residuals will be remixed by using scaling parameter 1 (or a value close to 1, in cases of soft scaling parameters). Then the corresponding gain is generated based on the measure of the remixing loudness. Finally, the generated gain is applied to the remixing content that mixes the residual to the voice by using the same computed scaling parameter. Therefore, according to embodiments of the present disclosure, all the UGC noise residual in the three segments as exemplified above would not be boosted but rather ducked, thereby mitigating the noise boosting and pumping problems.

Moreover, it is to be noted that although specific implementations including the equations have been described above, they are merely provided to serve an illustrative purpose but not as a limitation of any kind. For instance, as noted above, the separation of the audio objects may be further extended to support even more kinds/types of audio data. Of course, the corresponding audio analysis and classification process would have to be adapted accordingly, as can be understood and appreciated by the skilled person.

Figures 3, 4:
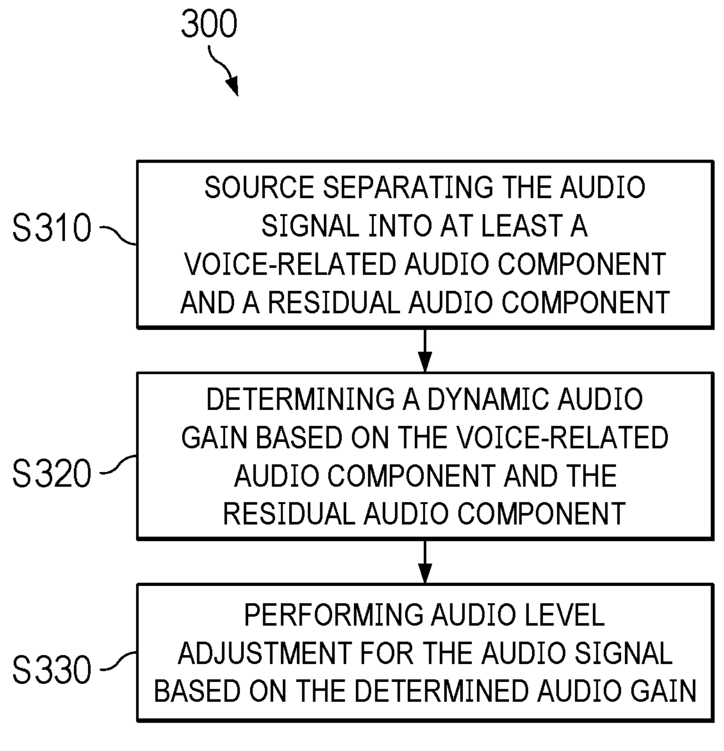
FIG. 3 is a schematic flowchart illustrating an example of a method of performing content-aware audio processing for an audio signal according to embodiments of the present disclosure.
FIG. 4 is a schematic block diagram of an example apparatus for performing methods according to embodiments of the present disclosure.

FIG. 3 is a schematic flowchart illustrating an example of a method 300 of performing content-aware audio processing for an audio signal according to embodiments of the present disclosure. The audio signal may be represented as an audio waveform (e.g., in the form of frames) in the time-frequency domain, or the like. Depending on various implementations, the audio may be first—if necessary—pre-processed. In some possible implementations, this may involve (but is certainly not limited to) dividing the audio signal into a sequence of windowed, (half-)overlapping blocks, converting the audio signal data to the frequency domain (e.g., by using a filter bank, a time-frequency transformation such as fast Fourier transform (FFT), etc.), or the like, Further, the audio signal may be seen as a mixture that comprises a plurality of audio components (or sometimes also referred to as audio objects) of different types. As can be understood and appreciated by the skilled person, depending on possible implementations, use cases and/or requirements, audio components (audio objects) may be classified into various types, such as (but certainly not limited to) voice, (background) noise, or—if necessary—even further classified into speech, singing, laughter, music, instrument sound, (artificial) sound effect, etc. For instance, a movie segment may be understood to generally contain speech, background music, and sound effect at the same time, while a vlog segment may be understood to generally contain speech and the background (ambient) noise at the same time. As another simple illustrative example, in some possible implementations, the audio components (audio objects) comprised in the audio signal may be simply categorized as of a "voice" type or of a remaining "residual" type.

In particular, the method 300 as shown in FIG. 3 may start at step 310 by source separating the audio signal into at least a voice-related audio component and a residual audio component. As illustrated above, the voice-related audio component may be understood to comprise (e.g., human or animal) voice, such as speech, singing, laughter, or the like; whilst the remaining, such as (background) noise, sound effect, musical instrument sound, or the like may all be understood to be comprised in the residual audio component. In some possible cases, the (source) separation may also be referred to as voice extraction (in other words, to extract the "voice" (component) out from other "residual" components of the whole audio signal). As may be understood and appreciated by the skilled person, processes related to the (source) separation may be implemented in any suitable manner. That is to say, depending on various implementations and/or requirements, the source separation (or in some cases, the voice extraction) functionality may be achieved for example by using a deep neural network (DNN)-based methodology and/or a (regular) signal processing-based methodology. In addition, the voice-related audio component and the residual audio component may be separated (or extracted) in parallel or in sequence, as can be understood and appreciated by the skilled person.

Subsequently, in step 320 the method 300 may comprise determining a dynamic audio gain based on the voice-related audio component and the residual audio component. The audio gain may be a dynamic gain in the time-frequency domain (or put differently, a time-frequency varying gain value). In other words, the so-determined audio gain may have a varying value for each time-frequency bin.

Finally, the method 300 may yet further comprise at step 330 performing audio level adjustment for the audio signal based on the determined audio gain. Since, as indicated above, the audio gain may be a dynamic gain in the time-frequency domain, the audio level adjustment may involve applying the (time-frequency varying) audio gain to the (respective amplitude of the) audio signal (also in the time-frequency domain), as can be understood and appreciated by the skilled person. As indicated earlier, in some possible implementations, applying the (time-frequency varying) audio gain to the input audio signal may involve applying each value (of a sequence of values) of the audio gain to a corresponding value (e.g., of a sequence of values) of the input audio signal in order to generate the respective value of the output audio signal.

Configured as described above, the proposed method may generally provide an efficient yet flexible manner for performing content-aware audio processing for an audio signal that comprises a plurality of audio components of different types, thereby improving the audio quality that is perceived for example by the end user. To the contrary, as noted above, conventional AGC and DRC techniques may generally multiply the whole audio mixture (including the voice and residual such as noise) by a (same) audio gain, which may cause the noise floor to be boosted and some unwanted perceptible pumping (especially in cases where UGCs typically being prepared in poor recording environments might be involved).

Finally, the present disclosure likewise relates to an apparatus for performing methods and techniques described throughout the present disclosure. FIG. 4 generally shows an example of such apparatus 400. In particular, apparatus 400 comprises a processor 410 and a memory 420 coupled to the processor 410. The memory 420 may store instructions for the processor 410. The processor 410 may also receive, among others, suitable input data (e.g., audio input), depending on various use cases and/or implementations. The processor 410 may be adapted to carry out the methods/techniques (e.g., method 300 as illustrated above with reference to FIG. 3) described throughout the present disclosure and to generate correspondingly output data 440 (e.g., dynamic audio gain, level adjusted audio signal, etc.), depending on use cases and/or implementations.

Interpretation

A computing device implementing the techniques described above can have the following example architecture. Other architectures are possible, including architectures with more or fewer components. In some implementations, the example architecture includes one or more processors (e.g., dual-core Intel® Xeon® Processors), one or more output devices (e.g., LCD), one or more network interfaces, one or more input devices (e.g., mouse, keyboard, touch-sensitive display) and one or more computer-readable mediums (e.g., RAM, ROM, SDRAM, hard disk, optical disk, flash memory, etc.). These components can exchange communications and data over one or more communication channels (e.g., buses), which can utilize various hardware and software for facilitating the transfer of data and control signals between components.

The term "computer-readable medium" refers to a medium that participates in providing instructions to processor for execution, including without limitation, non-volatile media (e.g., optical or magnetic disks), volatile media (e.g., memory) and transmission media. Transmission media includes, without limitation, coaxial cables, copper wire and fiber optics.

Computer-readable medium can further include operating system (e.g., a Linux® operating system), network communication module, audio interface manager, audio processing manager and live content distributor. Operating system can be multi-user, multiprocessing, multitasking, multithreading, real time, etc. Operating system performs basic tasks, including but not limited to: recognizing input from and providing output to network interfaces and/or devices; keeping track and managing files and directories on computer-readable mediums (e.g., memory or a storage device); controlling peripheral devices; and managing traffic on the one or more communication channels. Network communications module includes various components for establishing and maintaining network connections (e.g., software for implementing communication protocols, such as TCP/IP, HTTP, etc.).

Architecture can be implemented in a parallel processing or peer-to-peer infrastructure or on a single device with one or more processors. Software can include multiple software components or can be a single body of code.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor or a retina display device for displaying information to the user. The computer can have a touch surface input device (e.g., a touch screen) or a keyboard and a pointing device such as a mouse or a trackball by which the user can provide input to the computer. The computer can have a voice input device for receiving voice commands from the user.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

A system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Unless specifically stated otherwise, as apparent from the following discussions, it is appreciated that throughout the present invention discussions utilizing terms such as "processing", "computing", "calculating", "determining", "analyzing" or the like, refer to the action and/or processes of a computer or computing system, or similar electronic computing devices, that manipulate and/or transform data represented as physical, such as electronic, quantities into other data similarly represented as physical quantities.

Reference throughout this invention to "one example embodiment", "some example embodiments" or "an example embodiment" means that a particular feature, structure or characteristic described in connection with the example embodiment is included in at least one example embodiment of the present invention. Thus, appearances of the phrases "in one example embodiment", "in some example embodiments" or "in an example embodiment" in various places throughout this invention are not necessarily all referring to the same example embodiment. Furthermore, the particular features, structures or characteristics may be combined in any suitable manner, as would be apparent to one of ordinary skill in the art from this invention, in one or more example embodiments.

As used herein, unless otherwise specified the use of the ordinal adjectives "first", "second", "third", etc., to describe a common object, merely indicate that different instances of like objects are being referred to and are not intended to imply that the objects so described must be in a given sequence, either temporally, spatially, in ranking, or in any other manner.

Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted", "connected", "supported", and "coupled" and variations thereof are used broadly and encompass both direct and indirect mountings, connections, supports, and couplings.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

It should be appreciated that in the above description of example embodiments of the present invention, various features of the present invention are sometimes grouped together in a single example embodiment, FIG., or description thereof for the purpose of streamlining the present invention and aiding in the understanding of one or more of the various inventive aspects. This method of invention, however, is not to be interpreted as reflecting an intention that the claims require more features than are expressly recited in each claim. Rather, as the following claims reflect, inventive aspects lie in less than all features of a single foregoing disclosed example embodiment. Thus, the claims following the Description are hereby expressly incorporated into this Description, with each claim standing on its own as a separate example embodiment of this invention.

Furthermore, while some example embodiments described herein include some but not other features included in other example embodiments, combinations of features of different example embodiments are meant to be within the scope of the present invention, and form different example embodiments, as would be understood by those skilled in the art. For example, in the following claims, any of the claimed example embodiments can be used in any combination.

In the description provided herein, numerous specific details are set forth. However, it is understood that example embodiments of the present invention may be practiced without these specific details. In other instances, well-known methods, structures and techniques have not been shown in detail in order not to obscure an understanding of this description.

Thus, while there has been described what are believed to be the best modes of the present invention, those skilled in the art will recognize that other and further modifications may be made thereto without departing from the spirit of the present invention, and it is intended to claim all such changes and modifications as fall within the scope of the present invention. For example, any formulas given above are merely representative of procedures that may be used. Functionality may be added or deleted from the block diagrams and operations may be interchanged among functional blocks. Steps may be added or deleted to methods described within the scope of the present disclosure.

Enumerated example embodiments ("EEEs") of the present disclosure have been described above in relation to methods and systems for determining an indication of an audio quality of an audio input. Thus, an embodiment of the present invention may relate to one or more of the examples, enumerated below:

EEE 1. A content-aware audio processing method of managing audio levels of diverse content types, the method comprising:

performing multi-object source separation of separating audio into one or more prominent objects and a residual;

performing audio analysis of identifying audio clusters of the audio and the one or more prominent objects;

performing level adjustment, the level adjustment deriving a dynamic gain; and applying the gain to remixing audio based on corresponding cluster information.

EEE 2. The method according to EEE 1, wherein the multi-object source separation includes separating the audio into speech and the residual (non-speech) components using machine learning.

EEE 3. The method according to EEE 1, wherein the audio analysis includes estimating a confidence of the audio as professionally generated content or user-generated content and estimating a confidence of the residual as noise or music/sound effects by using any machine learning method.

EEE 4. The method according to EEE 1, wherein the level adjustment includes loudness measure and gain computation.

EEE 5. The method according to EEE 4, wherein remixing loudness of the audio steered by the confidences in claim 3 as the input of loudness measure for AGC.

EEE 6. The method according to EEE 4, wherein remixing specific loudness in each band steered by the confidences in claim 3 as the input of loudness measure for DRC.

EEE 7. The method according to EEE 4, wherein the applying the remixing loudness and specific loudness computes a wideband loudness modification for AGC and a multi-band loudness modification for DRC, and then the two modifications are multiplied as the total multi-band loudness modification.

EEE 8. The method according to of EEE 7, wherein the time-frequency gain is generated by inverting the total multi-band loudness modification, and then the time-frequency gain is applied to the remixing speech and the residual part where the remixing parameter is computed by the confidences in claim 3.

EEE 9. A system comprising:

one or more processors; and a non-transitory computer-readable medium storing instructions that, upon execution by the one or more processors, cause the one or more processor to perform operations according to any one of EEEs 1 to 8.

EEE 10. A non-transitory computer-readable medium storing instructions that, upon execution by one or more processors, cause the one or more processor to perform operations according to any one of EEEs 1 to 8.

The invention claimed is:

1. A method of performing content-aware audio processing for an audio signal comprising a plurality of audio components of different types, the method comprising:

source separating the audio signal into at least a voice-related audio component and a residual audio component;

determining a dynamic audio gain based on the voice-related audio component and the residual audio component, wherein the determination of the dynamic audio gain involves identifying whether the audio signal relates to professionally generated content or user generated content; and performing audio level adjustment for the audio signal based on the determined dynamic audio gain.

2. The method according to claim 1, wherein the dynamic audio gain is a time varying and frequency dependent audio gain.

3. The method according to claim 1, wherein the source separation of the audio signal involves determining a time-frequency gain indicative of a ratio of the voice-related audio component in the audio signal.

4. The method according to claim 1, wherein the audio signal is represented in a plurality of time-domain blocks, and wherein identifying whether the audio signal relates to professionally generated content or user generated content comprises:

determining a second confidence score indicative of whether a current block of the audio signal relates to professionally generated content or user generated content based on the current block and at least one time-adjacent block of the audio signal.

5. The method according to claim 1, wherein the determination of the dynamic audio gain involves determining a scaling function based on at least one loudness measure of the audio signal, and wherein the dynamic audio gain is determined based on the scaling function.

6. The method according to claim 5, wherein the scaling function involves a first loudness scaling function for controlling long term loudness of the audio signal and a second loudness scaling function for controlling short term loudness of the audio signal.

7. The method according to claim 6, wherein the first loudness scaling function is determined based on a wide-band loudness measure of the audio signal being remixed using the voice-related audio component and the residual audio component by attenuating any noise component contained in the residual audio component when the audio signal is identified to relate to user generated content.

8. The method according to claim 6, wherein the second scaling function is determined based on a multi-band loudness measure of the audio signal being remixed using the voice-related audio component and the residual audio component by attenuating any noise component contained in the residual audio component when the audio signal is identified to relate to user generated content.

9. The method according to claim 6, wherein the first loudness scaling function $S_{AGC}[t]$ is determined as a function $\Phi_{AGC}$ of a first predetermined output loudness measure $L_{o\_AGC}[t]$ and a first input loudness measure $L_{i\_AGC}[t]$ according to $S_{AGC}[t]=\Phi_{AGC}\{L_{o\_AGC}[t], L_{i\_AGC}[t]\}$, wherein $L_{i\_AGC}[t]=L_X[t]+(1-P_Y[t]P_z[t])\ L_Y[t]$, where $L_X[t]$ denotes a first loudness measure calculated for the voice-related audio component, $L_Y[t]$ denotes a first loudness calculated for the residual audio component, $P_Y[t]$ denotes a confidence score indicative of whether the residual audio component is identified to relate to noise, $P_Z[t]$ denotes a confidence score indicative of whether the audio signal is identified to related to user generated content, and t denotes the time index.

10. The method according to claim 9, wherein the second loudness scaling function $S_{DRC}[t]$ is determined as a function $\Phi_{DRC}$ of a second predetermined output loudness measure $N_{o\_DRC}[t]$ and a second input loudness measure $N_{i\_DRC}[t]$ and further based on the first loudness scaling function $S_{AGC}[t]$ according to $S_{DRC}[b, t]=\Phi_{DRC}\{N_{i\_DRC}[b, t], N_{o\_DRC}[b, t], L_{o\_AGC}[t], L_{i\_AGC}[t], S_{AGC}[t]\}$, wherein $N_{i\_DRC}[b, t]=N_X[b, t]+(1-P_Y[t]P_z[t])N_Y[b, t]$, where $N_X[t]$ denotes a second loudness measure calculated for the voice-related audio component, $N_Y[t]$ denotes a second loudness measure calculated for the residual audio component, and b denotes the band index in the loudness domain.

11. The method according to claim 10, wherein the scaling function S[b, t] is determined based on the first loudness scaling function and the second loudness scaling function according to $S[b, t]=S_{AGC}[t]S_{DRC}[t]$.

12. The method according to claim 1, wherein the audio level adjustment is performed such that any noise component in the residual audio component is attenuated when the audio signal is identified to relate to user generated content.

13. The method according to claim 1, wherein the source separation of the audio signal and/or the determination of the dynamic audio gain involves at least one machine learning based algorithm.

14. An apparatus, comprising a processor and a memory coupled to the processor, wherein the processor is adapted to cause the apparatus to carry out the method according to claim 1.

15. A non-transitory, computer-readable storage medium storing instructions that when executed by at least one processor, cause the at least one processor to carry out the method according to claim 1.

16. A method of performing content-aware audio processing for an audio signal comprising a plurality of audio components of different types, the method comprising:

source separating the audio signal into at least a voice-related audio component and a residual audio component;

determining a dynamic audio gain based on the voice-related audio component and the residual audio component, wherein the determination of the dynamic audio gain involves identifying whether the residual audio component relates to noise or not; and performing audio level adjustment for the audio signal based on the determined dynamic audio gain, wherein the residual audio component is represented in a plurality of time-domain blocks, and wherein identifying whether the residual audio component relates to noise or not comprises:

determining a first confidence score indicative of whether a current block of the residual audio component relates to noise or not based on the current block and at least one time-adjacent block of the residual audio component.

17. The method according to claim 16, wherein the determination of the dynamic audio gain involves determining a scaling function based on at least one loudness measure of the audio signal, and wherein the dynamic audio gain is determined based on the scaling function.

18. The method according to claim 17, wherein the scaling function involves a first loudness scaling function for controlling long term loudness of the audio signal and a second loudness scaling function for controlling short term loudness of the audio signal.

19. The method according to claim 18, wherein the first loudness scaling function $S_{AGC}[t]$ is determined as a function $\Phi_{AGC}$ of a first predetermined output loudness measure $L_{o\_AGC}[t]$ and a first input loudness measure $L_{i\_AGC}[t]$ according to $S_{AGC}[t]=\Phi_{AGC}\{L_{o\_AGC}[t], L_{i\_AGC}[t]\}$, wherein $L_{i\_AGC}[t]=L_X[t]+(1-P_Y[t]P_z[t])\ L_Y[t]$, where $L_X[t]$ denotes a first loudness measure calculated for the voice-related audio component, $L_Y[t]$ denotes a first loudness calculated for the residual audio component, $P_Y[t]$ denotes a confidence score indicative of whether the residual audio component is identified to relate to noise, $P_Z[t]$ denotes a confidence score indicative of whether the audio signal is identified to related to user generated content, and t denotes the time index.

20. The method according to claim 19, wherein the second loudness scaling function $S_{DRC}[t]$ is determined as a function $\Phi_{DRC}$ of a second predetermined output loudness measure $N_{o\_DRC}[t]$ and a second input loudness measure $N_{i\_DRC}[t]$ and further based on the first loudness scaling function $S_{AGC}[t]$ according to $S_{DRC}[b, t]=\Phi_{DRC}\{N_{i\_DRC}[b, t], N_{o\_DRC}[b, t], L_{o\_AGC}[t], L_{i\_AGC}[t], S_{AGC}[t]\}$, wherein $N_{i\_DRC}[b, t]=N_X[b, t]+(1-P_Y[t]P_z[t])N_Y[b, t]$, where $N_X[t]$ denotes a second loudness measure calculated for the voice-related audio component, $N_Y[t]$ denotes a second loudness measure calculated for the residual audio component, and b denotes the band index in the loudness domain.

21. The method according to claim 20, wherein the scaling function S[b, t] is determined based on the first loudness scaling function $S_{AGC}[b, t]$ and the second loudness scaling function according to $S_{DRC}[b, t]$ as $S[b, t]=S_{AGC}[b, t]S_{DRC}[b, t]$.

22. The method according to claim 16, wherein the dynamic audio gain is a time varying and frequency dependent audio gain.

23. The method according to claim 16, wherein the source separation of the audio signal involves determining a time-frequency gain indicative of a ratio of the voice-related audio component in the audio signal.

24. An apparatus, comprising a processor and a memory coupled to the processor, wherein the processor is adapted to cause the apparatus to carry out the method according to claim 16.

25. A non-transitory, computer-readable storage medium storing instructions that when executed by at least one processor, cause the at least one processor to carry out the method according to claim 16.

26. A method of performing content-aware audio processing for an audio signal comprising a plurality of audio components of different types, the method comprising:

source separating the audio signal into at least a voice-related audio component and a residual audio component;

determining a dynamic audio gain based on the voice-related audio component and the residual audio component; and performing audio level adjustment for the audio signal based on the determined dynamic audio gain, wherein the audio level adjustment is performed by applying the determined audio gain in the time-frequency domain according to $$Z[k,t]=G[k,t]\{X[k,t]+(1-P_y[t]P_z[t])Y[k,t]\},$$

wherein Z[k, t] denotes the level-adjusted audio signal, X[k, t] denotes the voice-related audio component in the audio signal, Y[k, t] denotes the residual audio component in the audio signal, $P_Y[t]$ denotes a confidence score indicative of whether the residual audio component is identified to relate to noise, $P_Z[t]$ denotes a confidence score indicative of whether the audio signal is identified to relate to user generated content, k denotes the frequency index, and t denotes the time index.

27. The method according to claim 26, wherein the determination of the dynamic audio gain involves determining a scaling function based on at least one loudness measure of the audio signal, and wherein the dynamic audio gain is determined based on the scaling function.

28. The method according to claim 26, wherein the scaling function involves a first loudness scaling function for controlling long term loudness of the audio signal and a second loudness scaling function for controlling short term loudness of the audio signal.

29. The method according to claim 26, wherein the source separation of the audio signal and/or the determination of the dynamic audio gain involves at least one machine learning based algorithm.

30. The method according to claim 26, wherein the dynamic audio gain is a time varying and frequency dependent audio gain.

31. The method according to claim 26, wherein the source separation of the audio signal involves determining a time-frequency gain indicative of a ratio of the voice-related audio component in the audio signal.

32. An apparatus, comprising a processor and a memory coupled to the processor, wherein the processor is adapted to cause the apparatus to carry out the method according to claim 26.

33. A non-transitory, computer-readable storage medium storing instructions that when executed by at least one processor, cause the at least one processor to carry out the method according to claim 26.

* * * * *